US012793764B2

(12) United States Patent
Shore et al.

(10) Patent No.: US 12,793,764 B2
(45) Date of Patent: Nov. 10, 2026

(54) MEMORY WITH PARTIAL ARRAY DENSITY SECURITY, AND ASSOCIATED SYSTEMS, DEVICES, AND METHODS

(71) Applicant: Micron Technology, Inc., Boise, ID (US)

(72) Inventors: Michael A. Shore, Boise, ID (US); Nathaniel J. Meier, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 485 days.

(21) Appl. No.: 17/877,296

(22) Filed: Jul. 29, 2022

(65) Prior Publication Data

US 2024/0038290 A1 Feb. 1, 2024

(51) Int. Cl.
*G11C 11/4078* (2006.01)
*G11C 11/406* (2006.01)

(52) U.S. Cl.
CPC ..... *G11C 11/4078* (2013.01); *G11C 11/40611* (2013.01)

(58) Field of Classification Search
CPC . G11C 11/4078; G11C 11/40611; G11C 7/02; G11C 7/1009; G11C 7/24; G11C 11/40622; G11C 11/4087
See application file for complete search history.

(56) References Cited

U.S. PATENT DOCUMENTS 10,790,005 B1 * 9/2020 He .................... G11C 11/40615
10,811,066 B2 * 10/2020 Jones .................. G11C 11/4087
10,824,573 B1 11/2020 Meier
2002/0191466 A1 * 12/2002 Hwang ............... G11C 11/4087 365/222
2007/0014168 A1 * 1/2007 Rajan ..................... G11C 29/24 365/201
2016/0005452 A1 * 1/2016 Bae ..................... G06F 11/1048 714/764
2018/0342281 A1 * 11/2018 Yoo ..................... G11C 11/4085
(Continued)

OTHER PUBLICATIONS

Memory Refresh article (archived on WaybackMachine Jun. 22, 2022) <https://web.archive.org/web/20220601222103/https://en.wikipedia.org/wiki/Memory_refresh> (Year: 2022).*

*Primary Examiner* — Alexander Sofocleous
*Assistant Examiner* — James S. Wells
(74) *Attorney, Agent, or Firm* — Dorsey & Whitney LLP

(57) ABSTRACT

Memory with partial array density security is disclosed herein. In one embodiment, an apparatus comprises a memory region including a plurality of memory rows, a plurality of memory columns, and a plurality of memory cells arranged at intersections of the plurality of memory rows and the plurality of memory columns. The plurality of memory rows includes a plurality of enabled memory rows and a plurality of disabled memory rows. Sets of one or more disabled memory rows are interleaved with enabled memory rows within the memory region. To write data to or read data from the memory region, the apparatus can be configured to access only the enabled memory rows of the memory region. The apparatus may further be configured to refresh disabled memory rows of the memory region according to a different refresh protocol from a refresh protocol used to refresh the enabled memory rows of the memory region.

13 Claims, 5 Drawing Sheets

(56) References Cited

U.S. PATENT DOCUMENTS

| | | | | |
|---|---|---|---|---|
| 2019/0043558 | A1* | 2/2019 | Suh | G11C 7/1006 |
| 2020/0211636 | A1* | 7/2020 | Hiscock | G11C 11/4074 |
| 2021/0098047 | A1* | 4/2021 | Harms | G11C 11/406 |
| 2021/0407583 | A1* | 12/2021 | Penney | G11C 11/406 |

* cited by examiner

MEMORY WITH PARTIAL ARRAY DENSITY SECURITY, AND ASSOCIATED SYSTEMS, DEVICES, AND METHODS

TECHNICAL FIELD

The present disclosure is related to memory systems, devices, and associated methods. For example, several embodiments of the present disclosure are directed to memory systems and devices with partial array density security, and associated refresh methods.

BACKGROUND

Memory devices are widely used to store information related to various electronic devices such as computers, wireless communication devices, cameras, digital displays, and the like. Memory devices are frequently provided as internal, integrated circuits and/or as part of external removable devices in computers or other electronic devices. There are many different types of memory, including volatile and non-volatile memory. Volatile memory, including static random-access memory (SRAM), dynamic random-access memory (DRAM), and synchronous dynamic random-access memory (SDRAM), among others, may require a source of applied power to maintain its data. Non-volatile memory, by contrast, can retain its stored data even when not externally powered. Non-volatile memory is available in a wide variety of technologies, including flash memory (e.g., NAND and NOR) phase change memory (PCM), ferroelectric random-access memory (FeRAM), resistive random-access memory (RRAM), and magnetic random-access memory (MRAM), among others. Improving memory devices, generally, may include increasing memory cell density, increasing performance (e.g., read, write, erase speeds) or otherwise reducing operational latency, increasing reliability, increasing data retention, reducing power consumption, reducing manufacturing costs, or reducing dimensional attributes, among other metrics.

BRIEF DESCRIPTION OF THE DRAWINGS

The present disclosure will be understood more fully from the detailed description given below and from the accompanying drawings of various embodiments of the present disclosure. The components in the drawings are not necessarily to scale. Instead, emphasis is placed on illustrating clearly the principles of the present technology. The drawings should not be taken to limit the disclosure to the specific embodiments depicted, but are for explanation and understanding only.

DETAILED DESCRIPTION

Figure 1A:
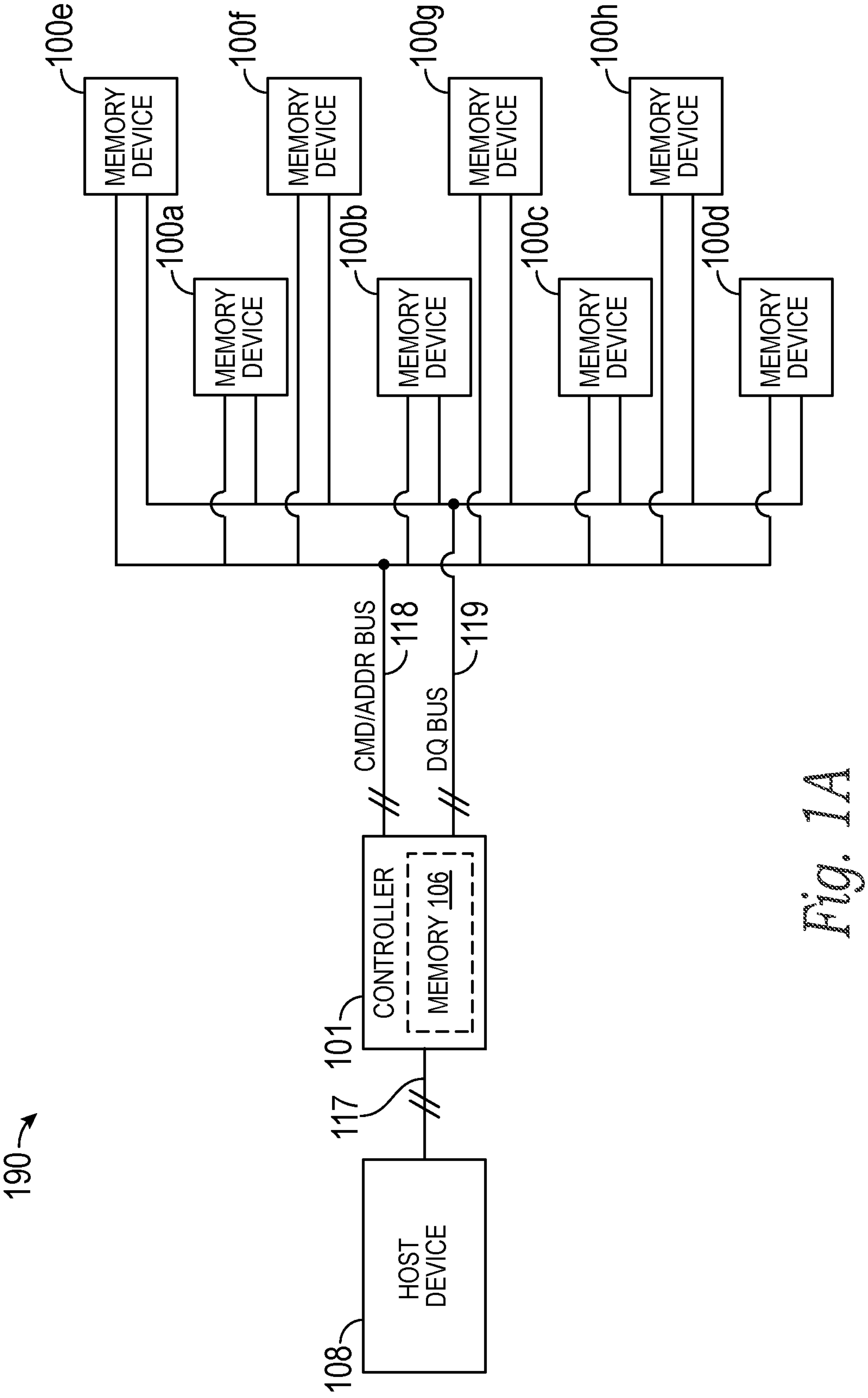
FIG. 1A is a block diagram schematically illustrating a memory system configured in accordance with various embodiments of the present technology.

As discussed in greater detail below, the technology disclosed herein relates to memory systems and devices having secure memory regions in which less than the full amount of each region (e.g., half the region, a quarter of the region) is used to store data, and to associated methods of refreshing such secure memory regions. Intentional use of less than a full amount of a memory region is referred to herein as partial array density (PAD) security. A person skilled in the art will understand that the technology may have additional embodiments and that the technology may be practiced without several of the details of the embodiments described below with reference to FIGS. 1A-4.

In the illustrated embodiments below, the memory devices and systems are primarily described in the context of devices incorporating DRAM storage media. Memory devices configured in accordance with other embodiments of the present technology, however, can include other types of memory devices and systems incorporating other types of storage media, including PCM, SRAM, FRAM, RRAM, MRAM, read only memory (ROM), erasable programmable ROM (EPROM), electrically erasable programmable ROM (EEROM), ferroelectric, magnetoresistive, and other storage media, including non-volatile (e.g., flash, NAND and/or NOR) storage media.

Securing data can include preventing unauthorized access to memory cells in which the data is stored and/or improving retention (e.g., reliability) of the data stored in the memory cells. Data stored in memory can become unreliable (e.g., corrupted, lost) due to various factors. For example, charge leakage from memory cells can result in a loss of the data stored to the memory cells. Therefore, various memory cells (e.g., volatile memory cells) can be periodically refreshed at a particular rate to retain stored data values. But as memory cell density in a memory device increases, the amount of power consumed by the memory devices to refresh memory cells also increases.

As another example, certain patterns of access may increase the rate at which information stored in memory decays. As a specific example, repeated access to a given memory row (an aggressor memory row) can increase the rate at which information decays in neighboring memory rows (victim memory rows). Various other attacks are also possible, which may cause an increase rate of data degradation in the victims of the attack. In some circumstances, an attack may be inadvertent, and may be caused by a controller accessing the memory in a manner that causes an increased rate of information decay in some memory cells. In other circumstances, a malicious or nefarious actor may deliberately employ row toggle or row disturb attacks in an effort to gain access to data stored in memory and/or to intentionally alter the data stored in memory (e.g., by repeatedly accessing a particular row in rapid succession in an attempt to corrupt data stored to neighboring memory rows). Refreshing memory cells of the neighboring memory rows at a faster rate (e.g., during the row disturb attacks and/or using row disturb refresh service events) can improve or maintain the reliability of data stored to memory cells of the neighboring memory rows (e.g., by reducing the row disturb effects). But refreshing memory cells at a faster rate increases the amount of power consumed by the memory device. In addition, repeatedly performing row disturb refresh management service events on a victim memory row can turn that memory row into an aggressor and introduce row disturb loss on memory rows neighboring the victim-turned-aggressor memory row.

To address these concerns, the present technology is directed to memory devices and systems having partial array density (PAD) secure regions of memory in which less than all of the memory rows in the PAD secure regions are enabled and/or utilized to store data. For example, every other memory row and/or one out of every four memory rows in a PAD secure region can be enabled and/or utilized to store data. Stated another way, every other memory row and/or three out of every four memory rows in the PAD secure region can be disabled from being accessed and/or used to store data (e.g., determinate or valid data, such as user or system data). In some embodiments, a memory row can be disabled by disabling or masking one or more row address terms of a memory row address corresponding to the memory row. For example, a row address term of the memory row address can be tied or held to a single state (e.g., a high or '1' state) that is opposite the state (e.g., a low or '0' state) used for that row address term to address the memory row. Thus, at least while the row address term is tied or held to the single state, that memory row cannot be accessed, cannot be used to store determinate or valid data (e.g., user data, system data), and/or cannot be used by a nefarious actor to employ a row toggle or a row disturb attack.

Disabling memory rows within a PAD secure region can introduce a pad or buffer of disabled memory rows between groups or sets of one or more enabled memory rows of the PAD secure region that are usable to store data. For example, groups or sets of one or more disabled memory rows can be interleaved with enabled memory rows in the PAD secure region such that (a) enabled memory rows of the PAD secure region are (e.g., each) separated from one another by at least one disabled memory row and/or (b) groups or sets of one or more enabled memory rows of the PAD secure region are (e.g., each) separated from one another by at least one disabled memory row. The buffer of disabled memory rows in a PAD secure region between enabled memory rows is expected to reduce (e.g., lessen, minimize, eliminate) row disturb effects on an enabled memory row of the PAD secure region caused when repeatedly accessing another enabled memory row in the PAD secure region. Thus, the present technology is expected to reduce (e.g., lessen, minimize, eliminate) the likelihood that row disturb attacks successfully corrupt data stored to enabled memory rows of a PAD secure region, and/or to provide increased data security in the PAD secure region.

In some embodiments of the present technology, memory rows of PAD secure regions can be refreshed differently from memory rows outside of the PAD secure region, and/or disabled memory rows of a PAD secure region can be refreshed differently from enabled memory rows of the PAD secure region. For example, memory rows of PAD secure regions can be refreshed according to a first set of refresh protocols different from a second set of refresh protocols used for refreshing memory rows outside of the PAD secure region, and/or disabled memory rows of a PAD secure region can be refreshed according to a different refresh protocol from a refresh protocol used for refreshing enabled memory rows of the PAD secure region. As a specific example of different refresh protocols, because disabled memory rows of a PAD secure region are not used to store data, row disturb refresh service events to all or a subset of disabled memory rows identified as victim memory rows can be disabled. Disabling row disturb refresh service events to disabled memory rows conserves power that would have otherwise been consumed by performing row disturb refresh service events on those disabled memory rows.

As another specific example of different refresh protocols, row disturb refresh service events can be performed on victim memory rows within a threshold distance of an aggressor memory row. For instance, row disturb refresh service events can be performed on victim disabled memory rows that are physically positioned immediately adjacent an aggressor memory row (e.g., aggressor memory row+/−1) or within another threshold distance from the aggressor memory row (e.g., aggressor memory row+/−2, +/−3, and/or +/−4). Row disturb refresh service events to victim disabled memory rows outside of the threshold distance can be disabled, thereby conserving power that may otherwise have been consumed by performing row disturb refresh service events on the victim disabled memory rows outside of the threshold distance. In some embodiments, row disturb refresh service events can be performed on victim memory rows less frequently than row disturb refresh service events are scheduled to be performed on enabled memory rows, thereby further conserving power consumed by the memory device. In addition, performing a row disturb refresh service event on a victim disabled memory row can dissipate any charge pumped (e.g., by accessing an enabled memory row) into memory cells of the disabled memory row, thereby reducing the likelihood that voltages $V_{CELL}$ stored to memory cells of the disabled memory row reach levels that can damage the memory cells.

Additionally, or alternatively, row disturb refresh service events performed on a victim disabled memory row can be modified in comparison to a standard row disturb service event. For example, as part of a modified row disturb refresh service event performed on a victim disabled memory row, the disabled memory row can be fired without firing the corresponding sense amplifiers and/or bit lines, thereby conserving power that would have otherwise been consumed by powering the sense amplifiers. Firing the disabled memory row without firing the corresponding sense amplifiers can erase memory cells of the disabled memory row and program them with a midpoint voltage (e.g., a bit line precharge voltage $V_{BLP}$) or indeterminate data. This can dissipate charge pumped into memory cells of the disabled memory row while reducing stress placed on adjacent memory cells of an enabled memory row in the event of a short between one or more memory cells of the disabled row and one or more memory cells of the enabled memory row. In other words, storing a midpoint voltage or indeterminate data to memory cells of disabled memory rows of a PAD secure region is expected to increase data security of memory cells of enabled memory rows of the PAD secure region.

As still another specific example of different refresh protocols, auto-refresh operations for disabled memory rows of a PAD secure region can be disabled, modified, and/or performed less frequently than auto-refresh operations performed on enabled memory rows of the PAD secure region or than auto-refresh operations performed on enabled memory rows outside of the PAD secure region. Modified auto-refresh operations can include firing disabled memory rows without firing corresponding sense amplifiers and/or bit lines. Firing the disabled memory rows without firing the corresponding sense amplifiers can erase memory cells of the disabled memory rows and program them with a midpoint voltage (e.g., the bit line precharge voltage $V_{BLP}$) or indeterminate data. Thus, disabling, modifying, and/or performing auto-refresh operations less frequently for disabled memory rows of a PAD secure region are expected to offer the same or similar advantages (e.g., a reduction in power consumption, dissipation of charge pumped into memory cells of the disabled memory rows, and/or increase of data security of memory cells of enabled memory rows in the PAD secure region) as disabling, modifying, and/or performing row disturb refresh service events less frequently for disabled memory rows of a PAD secure region, as discussed above.

Therefore, the present technology can provide greater distances between aggressor memory rows and victim memory rows in a PAD secure region, while reducing an amount of power consumed by the memory device to refresh memory rows of the PAD secure region. Thus, the present technology is expected to reduce the effects of row disturb and/or row disturb attacks on data stored to enabled memory rows of the PAD secure region, to periodically dissipate charge pumped into memory cells of disabled memory rows and prevent damage to those memory cells that can result from high voltage $V_{CELL}$ levels stored to those memory cells, and/or reduce stress placed on adjacent memory cells of an enabled memory row in the event of a short between one or more memory cells of a disabled row and one or more memory cells of the enabled memory row. In other words, the present technology is expected to improve retention and security of data stored to memory cells of enabled memory rows within the PAD secure region. In turn, the present technology is expected to achieve improvement in memory device FIT rate (e.g., a reduction of failures per billion device hours), a reduction in the number of defective memory cells and/or memory rows within a memory device, and/or an increase in the performance of the memory array of the memory device.

FIG. 1A is a block diagram schematically illustrating a memory system 190 (e.g., a dual in-line memory module (DIMM)) configured in accordance with various embodiments of the present technology. In the illustrated embodiment, the memory system 190 includes a plurality of memory devices 100 (identified individually as memory devices 100*a*-100*h* in FIG. 1A), a controller 101, and a host device 108. In some embodiments, the memory devices 100 can be DRAM memory devices. Although illustrated with eight memory devices 100 in FIG. 1A, the memory system 190 can include a greater or lesser number of memory devices 100 in other embodiments of the present technology. Well-known components of the memory system 190 have been omitted from FIG. 1A and are not described in detail below so as to avoid unnecessarily obscuring aspects of the present technology.

The memory devices 100 can be connected to one or more electronic devices that are capable of utilizing memory for temporary or persistent storage of information, or a component thereof. For example, one or more of the memory devices 100 can be operably connected to one or more host devices. As a specific example, the memory devices 100 of the memory system 190 are connected to a host device 101 (hereinafter referred to as a "memory controller 101") and to a host device 108.

The memory devices 100 of FIG. 1A are operably connected to the memory controller 101 via a command/address (CMD/ADDR) bus 118 and a data (DQ) bus 119. As described in greater detail below with respect to FIG. 1B, the CMD/ADDR bus 118 and the DQ bus 119 can be used by the memory controller 101 to communicate commands, memory addresses, and/or data to the memory devices 100. In response, the memory devices 100 can execute commands received from the memory controller 101. For example, in the event a write command is received from the memory controller 101 over the CMD/ADDR bus 118, the memory devices 100 can receive data from the memory controller 101 over the data DQ bus 119 and can write the data to memory cells corresponding to memory addresses received from the memory controller 101 over the CMD/ADDR bus 118. As another example, in the event a read command is received from the memory controller 101 over the CMD/ADDR bus 118, the memory devices 100 can output data to the memory controller 101 over the data DQ bus 119 from memory cells corresponding to memory addresses received from the memory controller 101 over the CMD/ADDR bus 118.

As discussed in greater detail below, one or more of the memory devices 100 can include a partial array density (PAD) secure region of memory (not shown in FIG. 1A). A PAD secure region as used herein refers to a region of memory (e.g., a memory bank, a bank group, a subregion of a memory bank, a range of memory addresses, etc.) in a memory device 100 in which less than the full amount of memory cells in the region are enabled to store data. For example, as discussed in greater detail below, a subset (e.g., every other, every third, every fourth, etc.) of the memory rows in a PAD secure region can be enabled to store data such that memory rows of the PAD secure region that are enabled to store data include at least one physically neighboring memory row that is disabled from storing data. In other words, memory rows in the region that are usable to store data in a PAD secure region are interleaved with one or more memory rows that are disabled or are not usable to store data. Stated another way, neighboring memory rows of an enabled memory row can be disabled from storing data to pad or buffer the enabled memory row from other memory rows in the PAD secure region that are enabled to store data. As discussed above, this is expected to increase data retention and security capabilities of the region of memory.

In some embodiments, because the memory devices 100*a*-100*h* share the CMD/ADDR bus 118, a number of memory rows enabled on a memory device (e.g., memory device 100*a*) of a memory rank of the memory system 190 can match a number of memory rows enabled on each of the other memory devices of the memory rank (e.g., such that memory address range values match across the memory rank). For example, if every third memory row is enabled to store data on a first bank of the memory device 100*a*, then one out of every three memory rows on the first bank of each of the other memory devices of the memory rank including the memory device 100*a* can be enabled. Continuing with this example, which memory row of every three memory rows is enabled to store data on the first bank can be the same or vary across two of the memory devices of the memory rank. As a specific example, if every third memory row is enabled to store data on the first bank of the memory device 100*a* starting with the first memory row of the first memory bank, every third memory row on the first bank of the memory device 100*b* starting with the second memory row or the third memory row can be enabled to store data. Which memory row of every three memory rows is enabled to store data on the first bank of each memory device can depend on the specific scheme employed to disable memory rows of the first bank of each memory device. Stated another way, although the number of enabled memory rows on the first banks of the memory devices of a memory rank can be the same across the memory devices, different memory devices of the memory rank can employ the same scheme or difference schemes to disable memory rows of their respective first banks such that the position of an enabled memory row in every three memory rows can vary across the first banks of the different memory devices.

In the illustrated example, the memory controller 101 includes a memory 106 configured to store various processes, logic flows, and routines for controlling operation of the memory system 190, including managing the memory devices 100 and handling communications between the memory devices 100 and the host device 108. In some embodiments, the memory 106 can include memory registers storing, for example, memory pointers, fetched data, etc. The memory 106 can also include read-only memory (ROM) or other non-volatile memory, and/or volatile memory (e.g., SRAM). Although shown embedded in the memory controller 101 in FIG. 1A, the memory 106 can be positioned at other locations in the memory system 190 in other embodiments of the present technology, such as exterior the memory controller 101, the host device 108, and/or one or more of the memory devices 100*a*-100*h*.

In some embodiments, the memory 106 can be used to track PAD secure regions in one or more of the memory devices 100. For example, the memory controller 101 can track memory addresses of memory rows in the memory devices 100 (*a*) that correspond to PAD secure regions in memory arrays of the memory devices 100 and/or (b) that are enabled for (and/or that are disabled from) storing data. As a specific example, the memory controller 101 can use information in the memory 106 to identify which memory addresses correspond to memory rows in the memory device 100*a* that are usable to store data. Thus, continuing with this example, when the memory controller 101 receives a memory address from the host device 108 that corresponds to a memory row that is disabled in a PAD secure region of the memory device 100*a*, the memory controller 101 and/or the memory device 100*a* can ignore the associated command, return an error or null data to the host device 108, or translate the memory address to a different, enabled memory row of the memory device 100*a*. In these and other embodiments, a PAD secure region can be restricted such that the host device 108 and/or the memory controller 101 are prevented from accessing memory rows (both enabled and disabled) in the PAD secure region. PAD secure regions of the memory devices 100 are discussed in greater detail below.

The host device 108 of FIG. 1A may be a computing device such as a desktop or portable computer, a server, a hand-held device (e.g., a mobile phone, a tablet, a digital reader, a digital media player), or some component thereof (e.g., a central processing unit, a co-processor, a dedicated memory controller, etc.). The host device 108 may be a networking device (e.g., a switch, a router, etc.); a recorder of digital images, audio, and/or video; a vehicle; an appliance; a toy; or any one of a number of other products. In one embodiment, the host device 108 may be connected directly to one or more of the memory devices 100 (e.g., via a communications bus of signal traces (not shown)). Additionally, or alternatively, the host device 108 may be indirectly connected to one or more of the memory devices 100 (e.g., over a networked connection or through intermediary devices, such as through the memory controller 101 and/or via a communications bus 117 of signal traces).

Figure 1B:
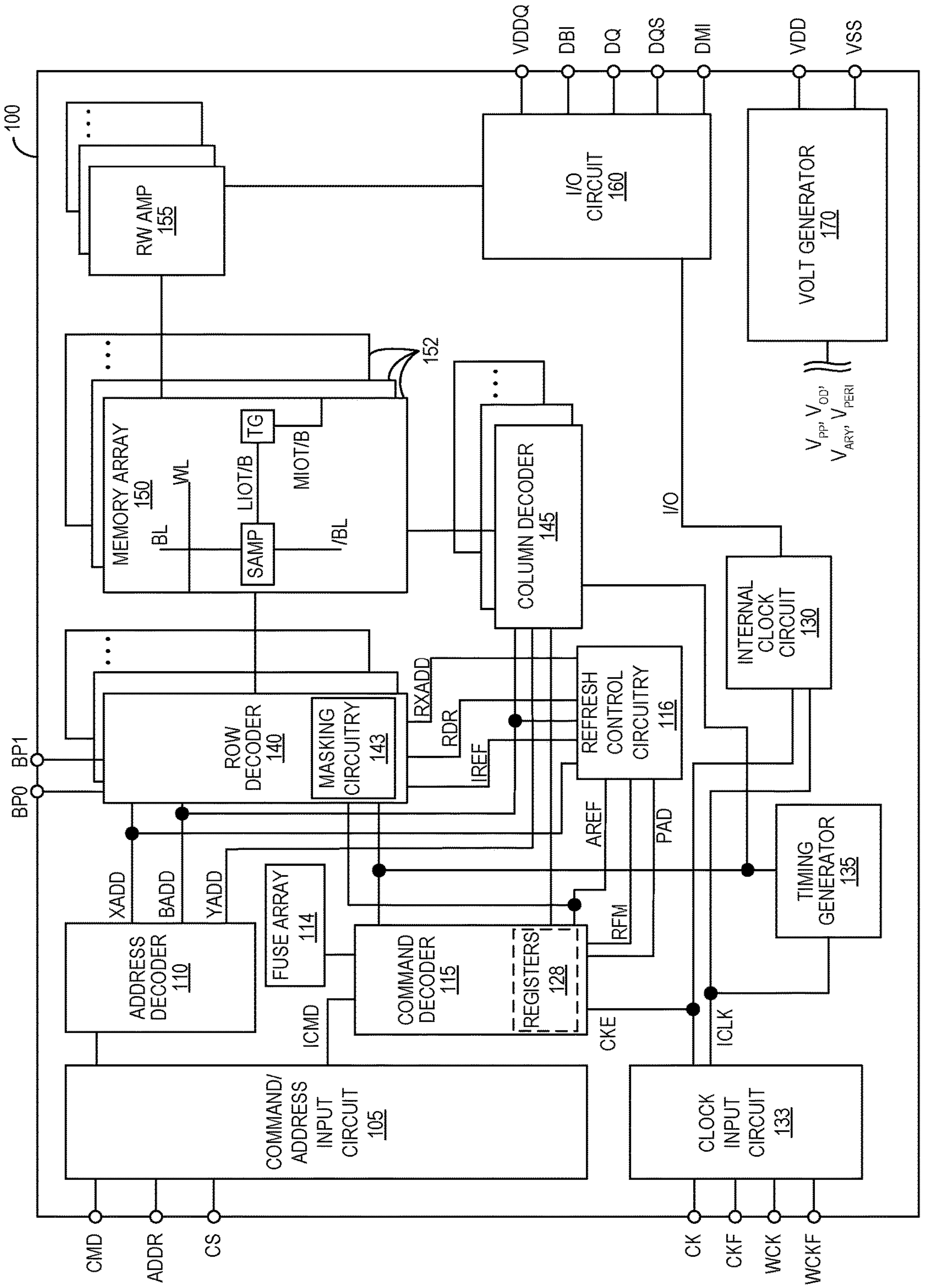
FIG. 1B is a block diagram schematically illustrating a memory device configured in accordance with various embodiments of the present technology.

FIG. 1B is a block diagram schematically illustrating a memory device 100 configured in accordance with various embodiments of the present technology. The memory device 100 may include an array of memory cells, such as memory array 150. The memory array 150 may include a plurality of memory banks 152 (e.g., four banks, eight banks, sixteen banks, thirty-two banks, or any other number of memory banks), and each memory bank 152 may include a plurality of word lines (WL), a plurality of bit lines (BL), and a plurality of memory cells (e.g., m×n memory cells) arranged at intersections of the word lines (e.g., m word lines, which may also be referred to as memory rows) and the bit lines (e.g., n bit lines, which may also be referred to as memory columns). Memory cells can include any one of a number of different memory media types, including capacitive, phase change, magnetoresistive, ferroelectric, or the like.

Each word line WL of the plurality may be coupled with a corresponding word line driver configured to control a voltage of the word line during memory operations. The selection of a word line WL may be performed by a row decoder 140, and the selection of a bit line BL (and/or a bit line /BL) may be performed by a column decoder 145. In the illustrated embodiment, the row decoder 140 includes a respective row decoder for each memory bank 152, and the column decoder 145 includes a respective column decoder for each memory bank 152.

Sense amplifiers (SAMP) may be provided for corresponding bit lines BL and /BL, and can be connected to at least one respective local I/O line pair (LIOT/B) that, in turn, can be coupled to at least one respective main I/O line pair (MIOT/B) via transfer gates (TG) that can function as switches. Read data from the bit line BL or the bit line /BL is amplified by the sense amplifier SAMP, and transferred to read/write amplifiers 155 over the local I/O line pair, the transfer gates TG, and the main I/O line pair MIOT/B. Write data output from the read/write amplifiers 155 is transferred to the sense amplifier SAMP over the main I/O line pair MIOT/B, the transfer gates TG, and the local I/O line pair LIOT/B, and thereafter written in or stored to a memory cell coupled to the bit line BL or the bit line /BL.

The memory device 100 may employ a plurality of external terminals that include command and address terminals coupled to a command/address bus (e.g., the CMD/ADDR bus 118 of FIG. 1A) to receive command signals CMD and address signals ADDR, respectively. The memory device may further include a chip select terminal to receive a chip select signal CS; clock terminals to receive clock signals CK and/or CKF; data clock terminals to receive data clock signals WCK, WCKF, and/or DQS; data terminals DQ, DBI (for data bus inversion function), and/or DMI (for data mask inversion function); and/or power supply terminals VDD, VSS, VDDQ, and/or VSSQ (not shown).

The power supply terminals may be supplied with power supply potentials VDD and VSS. These power supply potentials VDD and VSS can be supplied to an internal voltage generator circuit 170. The internal voltage generator circuit 170 can generate various internal potentials VPP, VOD, VARY, VPERI, and the like based on the power supply potentials VDD and VSS. The internal potential VPP can be used in the row decoder 140, the internal potentials VOD and VARY can be used in the sense amplifiers included in the memory array 150, and the internal potential VPERI can be used in various circuit blocks of the memory device 100.

The power supply terminals may also be supplied with power supply potentials VDDQ and/or VSSQ (not shown). The power supply potentials VDDQ and VSSQ can be supplied to an input/output circuit 160 together with the power supply potentials VDD and VSS. The power supply potentials VDDQ and VSSQ can be the same potentials as the power supply potentials VDD and VSS, respectively, in some embodiments of the present technology. The power supply potentials VDDQ and VSSQ can be different potentials from the power supply potentials VDD and VSS, respectively, in other embodiments of the present technology. The power supply potentials VDDQ and VSSQ can be used for the input/output circuit 160 so that power supply noise generated by the input/output circuit 160 does not propagate to the other circuit blocks of the memory device 100.

The external clock signals CK and CKF received at the clock terminals and/or the external data clock signals WCK and WCKF received at the data clock terminals can be supplied to a clock input circuit 133. For example, when enabled by a clock enable signal CKE, input buffers included in the clock input circuit 133 can receive the clock signals CK and CKF and/or the data clock signals WCK and WCKF. The CK and CKF signals can be complementary, and/or the WCK and WCKF signals can be complementary.

The clock input circuit 133 can generate an internal clock signal ICLK based on the clock signals CK, CKF, WCK, and/or WCKF. The internal clock signal ICLK signal can be supplied to an internal clock circuit 130. In turn, the internal clock circuit 130 can provide various phase and frequency controlled internal clock signals based on the internal clock signals ICLK and/or the clock enable signal CKE. The phase and frequency controlled internal clock signals can be used for timing operation of various internal circuits of the memory device 100. For example, the internal clock circuit 130 can provide input/output clock signals I/O to the input/output circuit 160 of the memory device 100. The input/output clock signals I/O can be used as timing signals for determining an output timing of read data and/or an input timing of write data. The input/output clock signals I/O can be provided at multiple clock frequencies so that data can be output from and/or input into the memory device 100 at different data rates. A higher clock frequency may be desirable when high memory speed is desired. A lower clock frequency may be desirable when lower power consumption is desired. The internal clock signals ICLK can additionally or alternatively be supplied to a timing generator 135 (e.g., to generate various internal clock signals) and/or to a command decoder 115.

The command/address terminals may be supplied with addresses signals ADDR from outside the memory device 100 (e.g., from a memory controller). The address signals ADDR supplied to the address terminals can be transferred, via the command/address input circuit 105, to an address decoder 110. The address decoder 110 can receive the address signals ADDR and supply a decoded row address signal (XADD) to the row decoder 140, and a decoded column address signal (YADD) to the column decoder 145. The address decoder 110 can also supply a decoded bank address signal (BADD) to the row decoder 140 and to the column decoder 145. The decoded bank address signal (BADD) can specify a memory bank 152 of the memory array 150 containing the decoded row address XADD and the decoded column address YADD.

The command/address terminals may further be supplied with command signals CMD and/or chip select signals CS from outside the memory device 100. The command signals may represent various memory commands (e.g., refresh commands; refresh management commands; activate commands; precharge commands; access commands, such as read commands and write commands; timing commands; etc.) from a memory controller. The access commands may be associated with one or more row addresses XADD, column addresses YADD, and bank addresses BADD to indicate which memory cells of the memory array 150 to access. The chip select signal CS may be used to select the memory device 100 to respond to commands and addresses provided to the command and address terminals of the memory device 100. When an active CS signal is provided to the memory device 100, the commands and addresses can be decoded and memory operations can be performed. When the CS signal is not active, the memory device 100 can ignore commands and/or addresses provided to the command and address terminals.

The command signals CMD received at the command terminals may be supplied to the command decoder 115, via the command/address input circuit 105, as internal command signals ICMD. The command decoder 115 can include circuits to decode the internal command signals ICMD and generate various internal signals and commands for performing memory operations. For example, the command decoder 115 can provide a row command signal to select a word line and a column command signal to select a bit line (e.g., in response to receiving an access command). Other examples of memory operations that the memory device 100 may perform based on decoding the internal command signals ICMD include refresh commands (e.g., re-establishing full charges stored in individual memory cells of the memory array 150), activate commands (e.g., activating a row in a particular memory bank 152, in some cases for subsequent access operations), or precharge commands (e.g., deactivating the activated row in the particular memory bank 152).

The command decoder 115, in some embodiments, may further include one or more registers 128 for tracking various counts and/or values (e.g., counts of refresh commands received by the memory device 100 or self-refresh operations performed by the memory device 100) and/or for storing various operating conditions for the memory device 100 to perform certain functions, features, and modes (or test modes). As such, in some embodiments, the registers 128 (or a subset of the registers 128) may be referred to as mode registers. Additionally, or alternatively, the memory device 100 may include registers 128 as a separate component outside of the command decoder 115. In some embodiments, the registers 128 may include multi-purpose registers (MPRs) configured to write and/or read specialized data to and/or from the memory device 100.

When a read command is issued to a memory bank 152 with an open row and a column address is timely supplied as part of the read command, read data can be read from memory cells in the memory array 150 designated by the row address (which may have been provided as part of the activate command identifying the open row) and the column address. The read command may be received by the command decoder 115, which can provide internal commands so that read data from the memory array 150 is output from the memory device 100 via the read/write amplifiers 155 and the input/output circuit 160, using the data terminals DQ, DBI, and/or DMI, and/or according to the DQS clock signal. The read data may be provided at a time defined by read latency information that can be programmed in the memory device 100, for example, in a mode register (e.g., one or more of the registers 128). The read latency information can be defined in terms of clock cycles of the CK clock signal. For example, the read latency information can be a number of clock cycles of the CK signal after the read command is received by the memory device 100 when the associated read data is provided.

When a write command is issued to a memory bank 152 with an open row and a column address is timely supplied as part of the write command, write data can be supplied to the data terminals DQ, DBI, and/or DMI. The write data can be supplied to the data terminals DQ, DMI, and/or DMI according to the WCK and WCKF clock signals. The write command may be received by the command decoder 115, which can provide internal commands to the input/output circuit 160 so that the write data can be received by data receivers in the input/output circuit 160, and supplied to the memory array 150 via the read/write amplifiers 155. The write data may be written in the memory cell designated by the row address and the column address. The write data may be provided to the data terminals at a time that is defined by write latency WL information. The write latency WL information can be programmed in the memory device 100, for example, in a mode register (e.g., one or more of the registers 128). The write latency WL information can be defined in terms of clock cycles of the CK clock signal. For example, the write latency information WL can be a number of clock cycles of the CK signal after the write command is received by the memory device 100 when the associated write data is received.

The memory device 100 can also receive commands instructing the memory device 100 to perform one or more refresh operations. For example, the memory device 100 can be periodically placed into a refresh mode by programming one or more of the registers 128 and/or using a refresh entry mode command, and the memory device 100 can periodically perform refresh operations each time the memory device is placed in the refresh mode. In some embodiments, the refresh entry mode command can be periodically generated internally by an internal component of the memory device 100. In these and other embodiments, the refresh entry mode command can be externally supplied to the memory device 100. When a refresh entry mode command is externally supplied to the memory device 100, the command decoder 115 can activate an auto-refresh signal AREF. The auto-refresh signal AREF can be a pulse signal. The command decoder 115 can activate the auto-refresh signal AREF once in response to receiving a refresh entry mode command, and thereafter can cyclically activate the auto-refresh signal AREF at a desired timing or cadence (e.g., until an auto-refresh operation is complete or until the refresh entry mode command times out). The auto-refresh signal AREF can be used to control timing of refresh operations performed by the memory device 100 while the memory device 100 is in a refresh mode.

In some embodiments, a self-refresh signal SREF (not shown) can be used in addition to or in lieu of the auto-refresh signal AREF. For example, the command decoder 115 can activate a self-refresh signal SREF in response to the memory device 100 entering into a self-refresh mode, and thereafter can cyclically activate the self-refresh signal SREF at a desired timing or cadence until the memory device 100 exits the self-refresh mode (e.g., in response to receiving a self-refresh exit command). Thus, where context permits, reference to and teaching regarding auto-refresh operations, auto-refresh signals AREF, auto-refresh addresses, etc. herein is to be interpreted as also reference to and teaching regarding self-refresh operations, self-refresh signals SREF, self-refresh addresses, etc.

In some embodiments, the command decoder 115 supplies the auto-refresh signal AREF to refresh control circuitry 116 of the memory device 100. In turn, the refresh control circuitry 116 supplies a refresh row address RXADD to the row decoder 140 to refresh one or more wordlines WL indicated by the refresh row address RXADD. In some embodiments, the refresh address RXADD can represent a single wordline. In these and other embodiments, the refresh address RXADD can represent multiple wordlines that can be refreshed sequentially or simultaneously by the row decoder 140. In some embodiments, the number of wordlines represented by the refresh address RXADD can vary from one refresh to another. The refresh control circuitry 116 can control a timing of the refresh operation.

The refresh address RXADD output by the refresh control circuitry 116 can be a targeted refresh address (e.g., a refresh address that specifies one or more victim memory row addresses based on an identified aggressor memory row address) or an auto-refresh address (e.g., taken from a sequence of auto-refresh addresses). Based on the type of refresh address RXADD supplied by the refresh control circuitry 116, the row decoder 140 can perform a targeted refresh (also referred to herein as a row disturb refresh (RDR) service event) or auto-refresh operation. The auto-refresh addresses can correspond to a sequence of memory addresses that the refresh control circuitry 116 can step through based on activations of the refresh signal AREF. Thus, the refresh control circuitry 116 can cycle through the sequence of auto-refresh addresses at a rate determined by activation of the refresh signal AREF. In some embodiments, the memory device 100 can perform auto-refresh operations at a high enough frequency such that no information stored to a wordline is expected to degrade in the time between consecutive auto-refresh operations performed on that wordline. In other words, the memory device 100 can be configured to perform auto-refresh operations such that each wordline is refreshed at a rate faster than the expected rate of information decay.

The refresh control circuitry 116 can also determine targeted refresh addresses that correspond to memory rows (e.g., victim memory rows) that require refreshing based on the access pattern of nearby or neighboring memory rows (e.g., aggressor memory rows) in the memory array 150. The refresh control circuitry 116 may use one or more signals of the memory device 100 to calculate targeted refresh addresses for the refresh address RXADD. For example, targeted refresh addresses may be a calculated based on row addresses XADD and/or bank addresses BADD provided by the address decoder 110. In some embodiments, the refresh control circuitry 116 may sample the current value of the row address XADD provided by the address decoder 110 along a row address bus, and determine a targeted refresh address based on one or more of the sampled addresses. The sampled addresses may be stored in a data storage unit of the refresh control circuitry 116. When a row address XADD is sampled, it may be compared to the stored addresses in the data storage unit. In some embodiments, an aggressor memory row address may be determined based on the sampled and/or stored addresses. For example, a comparison between a sampled memory row address XADD and stored memory row addresses may be used to update a count value (e.g., an access count) associated with the stored memory row addresses, and an aggressor memory row address may be calculated based on the count values. Based on the identified aggressor memory row addresses, the refresh control circuitry 116 can determine targeted refresh memory row addresses to output as refresh addresses RXADD to the row decoder 140. In these and other embodiments, targeted memory row addresses may be supplied to the memory device 100 and/or to the refresh control circuitry 116 by a controller (e.g., the controller 101 of FIG. 1A), such as when the controller issues a directed refresh management command to the memory device 100. In turn, the refresh control circuitry 116 can output the targeted row addresses as refresh addresses RXADD to the row decoder 140.

While in general the present disclosure refers to determining aggressor and victim wordlines and addresses, it should be understood that as used herein, an aggressor wordline does not necessarily need to cause data degradation in neighboring wordlines, and a victim wordline does not necessarily need to be subject to such degradation. The refresh control circuitry 116 may use some criteria to judge whether a memory row address is an aggressor memory row address, which may capture potential aggressor memory row addresses rather than definitively determining which memory row addresses correspond to memory rows that are causing data degradation in nearby victim memory rows. For example, the refresh control circuitry 116 may determine potential aggressor memory row addresses based on a pattern of accesses to the memory row addresses, and this criterion may include some memory row addresses that are not aggressors, or may miss some memory row addresses that are aggressors. Similarly, victim memory row addresses may be determined based on which wordlines are expected to be affected by aggressors, rather than a definitive determination of which wordlines are undergoing an increased rate of data decay.

The refresh address RXADD may be output by the refresh control circuitry 116 according to a timing that is based on activation timings of the refresh signal AREF. For example, upon each activation of the refresh signal AREF, the refresh control circuitry 116 may be afforded one or more time slots in which to output refresh addresses RXADD, and the refresh control circuitry 116 can output one or more refresh addresses RXADD during each time slot. In some embodiments, certain time slots may be reserved for targeted refresh addresses, and the refresh control circuitry 116 may determine whether to provide a targeted refresh address during the time slots, not provide an address during the time slots, or provide an auto-refresh address instead of a targeted refresh address during the time slots.

The refresh control circuitry 116 may use multiple methods to determine the timing of targeted refresh operations. For example, during a refresh mode of the memory device 100, the refresh control circuitry 116 can instruct the memory device 100 to perform auto-refresh operations and targeted refresh operations (e.g., by providing a targeted refresh address as the refresh address RXADD) based on a periodic schedule. As a specific example, after entering a refresh mode, the refresh control circuitry 116 can instruct the memory device 100 to perform a certain number of auto-refresh operations, and then instruct the memory device 100 to perform a certain number of targeted refresh operations.

The refresh control circuitry 116 may also respond to requested targeted refresh operations or requested panic targeted refresh operations that may be based on access patterns to a memory bank 152 or other region of memory. For example, the memory device 100 may receive refresh management commands (e.g., at the command/address terminals). In response, the command decoder 115 can provide a refresh management signal RFM to the refresh control circuitry 116 based on the refresh management command. Responsive to activation of the refresh management signal RFM, the refresh control circuitry 116 may indicate that a panic targeted refresh operation should be performed. These panic targeted refresh operations may happen outside of a refresh period. For example, a high rate of accesses to a memory bank 152 may indicate that an attack is taking place, and the command decoder 115 and/or the refresh control circuitry 116 can count the access commands and instruct the memory device 100 to perform a panic targeted refresh operation once the count exceeds a threshold. As the number of panic targeted refresh operations increases, the refresh control circuitry 116 may decrease a number of periodic targeted refresh operations during the next refresh mode. It should be understood that the process of refreshing wordlines during a periodic and panic targeted refresh operation may generally be the same, and the difference may generally be in the timing of when the refreshes are performed.

Figure 2:
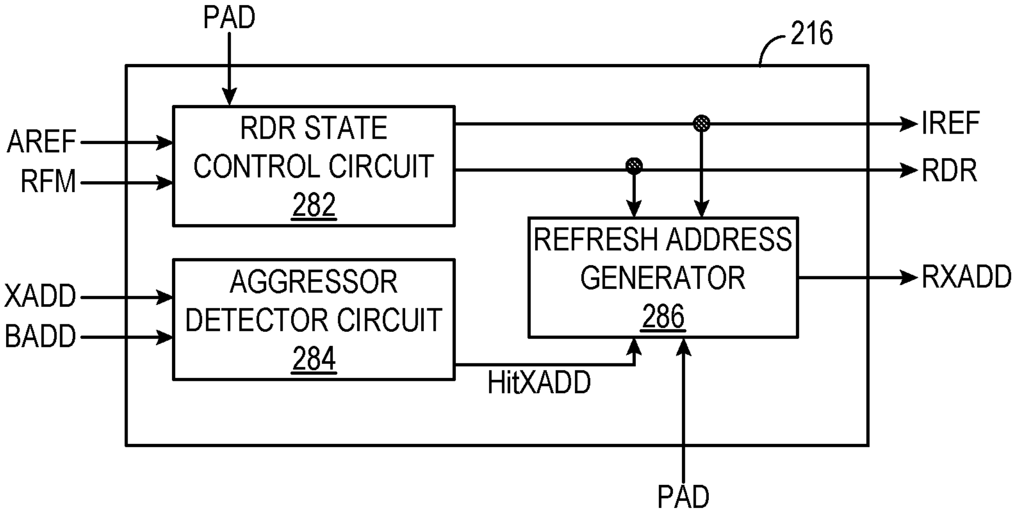
FIG. 2 is a block diagram schematically illustrating a refresh control circuit configured in accordance with various embodiments of the present technology.

FIG. 2 is a block diagram schematically illustrating a refresh control circuit 216 configured in accordance with various embodiments of the present technology. The refresh control circuit 216 can be the refresh control circuitry 116 of FIG. 1B, or a refresh control circuit that corresponds to a subset (e.g., a memory bank 152) of the memory array 150 of FIG. 1B. In embodiments in which the refresh control circuit 216 corresponds to a memory bank 152 of the memory array 150, the memory device 100 can include multiple instances of the refresh control circuit 216 (e.g., a refresh control circuit 216 for each memory bank 152). For the sake of clarity and example, the refresh control circuit 216 is discussed in detail below as corresponding to a single memory bank 152 of the memory array 150.

As shown in FIG. 2, the refresh control circuit 216 includes a row disturb refresh (RDR) state control circuit 282, an aggressor detector circuit 284, and a refresh address generator circuit 286. The RDR state control circuit 282 is configured to receive the refresh signal AREF and the refresh management signal RFM from the command decoder 115 of FIG. 1B, and to output (a) a row disturb refresh signal RDR to indicate that a row disturb refresh operation (e.g., a refresh of one or more victim memory rows corresponding to an identified aggressor memory row, also known as RDR service events) should occur, or (b) an internal refresh signal IREF to indicate that an auto-refresh operation should occur. Consistent with the discussion of the refresh control circuitry 116 above, the refresh control circuit 216 can output a refresh address RXADD within timing based on activation of the refresh signal AREF and/or the refresh management signal RFM. In some embodiments, the row disturb refresh signal RDR and/or the internal refresh signal IREF are output to a corresponding row decoder (e.g., the row decoder 140 of FIG. 1B). In turn, the row decoder can perform (i) a RDR refresh operation based on the RDR signal and the refresh address RXADD output from the refresh address generator circuit 286, or (b) an auto-refresh operation based on the internal refresh signal IREF and the refresh address RXADD.

The aggressor detector circuit 284 is configured to receive a decoded row address XADD and a decoded bank address BADD (e.g., from the address decoder 110 of FIG. 1B), and to sample the decoded row address XADD. For example, the aggressor detector circuit 284 may be coupled to all of the row addresses XADD sent along the row address bus between the address decoder 110 and the row decoder 140 of FIG. 1B, but may only receive (e.g., process, pay attention to) the current value of the row address XADD when the memory bank 152 corresponding to the refresh control circuit 216 is in a refresh mode or is referenced by the decoded bank address BADD. The sampled row addresses XADD can be stored in the aggressor detector circuit 284 and/or compared to previously stored addresses. The aggressor detector circuit 284 may provide a match address HitXADD to the refresh address generator circuit 286 based on a current row address XADD and/or previously stored row addresses. The match address HitXADD can correspond to a memory address of a memory row in the memory bank 152 that the aggressor detector circuit 284 has identified as an aggressor memory row. For example, the aggressor detector circuit 284 may (a) count a number of times that each row address XADD is received, and (b) output a memory address that has been received the most times or has been received greater than a threshold amount of times, as the match address HitXADD.

The refresh address generator circuit 286 can output a refresh address RXADD responsive to activation of the row disturb refresh signal RDR or the internal refresh signal IREF. As discussed above, the refresh address RXADD can be one or more auto-refresh memory addresses (e.g., one or more next memory row addresses in a sequence of memory row addresses) or can be one or more victim addresses corresponding to victim memory rows identified based at least in part on an aggressor memory row identified by a match address HitXADD received from the aggressor detector circuit 284. In some embodiments, the victim rows may include memory rows that are physically adjacent or neighboring to the aggressor row (e.g., HitXADD+1 and HitXADD−1). In some embodiments, the victim rows may also include memory rows that are physically adjacent to the physically adjacent rows of the aggressor memory row (e.g., HitXADD+2 and HitXADD−2). Other relationships between victim memory rows and the identified aggressor rows may be used in other examples. For example, +/−3, +/−4, and/or other rows may also be refreshed.

In some embodiments, the refresh control circuit 216 may instruct the memory device 100 to perform multiple refresh operations responsive to each activation of the refresh signal AREF. For example, each time the refresh signal AREF is received, the refresh control circuit 216 may instruct the memory device 100 to perform K different refresh operations, by providing K different refresh addresses RXADD. Each refresh operation may be referred to as a ‘pump’. Each of the K different refresh operations may be an auto-refresh operation or a targeted refresh operation. In some embodiments, the number of targeted and auto-refresh operations may be constant in each group of pumps responsive to an activation of the refresh signal AREF. In other embodiments, the number of targeted and auto-refresh operations may vary across different groups of pumps responsive to an activation of the refresh signal AREF.

Referring again to FIG. 1B, the memory array 150 of the memory device 100 can include one or more partial array density (PAD) secure regions. A PAD secure region can correspond to all or a subset of the memory array 150. For example, a PAD secure region can correspond to a memory bank 152, a memory bank group, a subregion of the memory bank, a range of memory addresses within a single bank 152 or across multiple banks 152, or any other region in the memory array 150. As discussed above, a PAD secure region can be a region in which less than the full amount of memory cells in the region are enabled and usable to store data. For example, a subset (e.g., every other, every third, every fourth, etc.) of the memory rows in a PAD secure region can be enabled to store data such that enabled memory rows each include at least one physically neighboring memory row that is disabled from storing data. Stated another way, one or more groups or sets of one or more disabled memory rows can be interleaved with enabled memory rows in the PAD secure region such that the disabled memory rows pad or buffer the enabled memory rows from one another.

In some embodiments, memory rows of a PAD secure region can be disabled by disabling or masking decoding of specific row address terms. For example, a row address term can be disabled by tying or holding the row address term to either a high state (e.g., ‘1’) or a low state (e.g., ‘0’). As a specific example, disabling the lowest order row address term of memory row addresses corresponding to a PAD secure region in the memory array 150 can disable every other memory row (one in every two consecutive memory rows) within the PAD secure region from storing data because memory row addresses corresponding to these disabled memory rows cannot be decoded or accessed while the lowest order row address term is tied or held to a single state. As another example, disabling the two lowest order row address terms of memory row addresses can disable three out of every four consecutive memory rows within the PAD secure region from storing data while the two lowest order row address terms are each tied or held to a single state. The single state to which the lowest order row address term is tied or held can be the same state as or a different state from the single state to which the second to lowest address term is tied or held. When only the lowest order row address term is disabled, the memory device 100 can store data in half of the memory rows within the PAD secure region; and when the two lowest order row address terms are disabled, the memory device can store data in a fourth of the memory rows within the PAD secure region. In other words, disabling row address terms can alter the availability of some memory rows in the PAD secure region to store data, and/or can alter the ability of the memory device 100 or an external device (e.g., a memory controller or a host device) operably connected to the memory device 100 from accessing or firing those disabled memory rows. As a result, the memory device 100 can store data (e.g., determinate or valid data, such as user or system data) in only a subset of the memory rows in a PAD secure region (e.g., in memory rows of the PAD secure region that remain enabled). Additional and/or higher order row address terms other than the lowest order and/or the second lowest order can be disabled or masked to, for example, disable a greater number of memory rows within a PAD secure region from storing data.

Row address terms can be permanently or temporarily disabled in some embodiments such that a PAD secure region can be permanently or temporarily defined in the memory array 150. For example, row address terms can be tied to or selectively coupled (e.g., via switches) to bond pins of the memory device 100. Bond pin BP0 and bond pin BP1 are shown in FIG. 1B and can correspond to the lowest order row address term and the second lowest order row address term, respectively. In the illustrated embodiment, the bond pins BP0 and BP1 each correspond to one of the row decoders 140 that corresponds to one of the memory banks 152 of the memory array 150. Thus, every other memory row or every fourth memory row of the corresponding memory bank 152 can be disabled from storing data (depending on whether just the bond pin BP0 is used or both the bond pins BP0 and BP1 are used), and the entire memory bank 152 can be configured as a PAD secure region. Each of the bond pins BP0 and BP1 facilitate tying or coupling the corresponding row address terms to a single state (e.g., to a high state or a low state, and/or using voltages supplied to the pins) such that decoding of memory row addresses corresponding to the opposite of the single is disabled. In some embodiments, the bond pins BP0 and BP1 can be selectively floated or can be selectively uncoupled from the corresponding row addresses terms. In this manner, memory rows can be selectively disabled and/or reenabled. A greater or lesser number of bond pins than shown in FIG. 1B can be used in other embodiments of the present technology.

As another example, row address terms can be permanently or temporarily disabled or masked using masking circuitry 143 of the memory device 100. The masking circuitry 143 can mask row address terms to disable corresponding memory rows in the PAD secure region. In some embodiments, the masking circuitry 143 can be programmed to mask specific memory row addresses and/or specific ranges of memory row addresses. This can provide greater flexibility in selecting which memory rows of a PAD secure region to disable as the masking circuitry 143 may not be beholden to disabling memory rows in only powers of two. Masking applied by the masking circuitry 143 can be permanent or temporary.

Disabling of memory rows in a PAD secure region can correspond to a partial array density (PAD) mode, PAD test mode, or other configuration of the memory device 100. For example, mode registers 128 of the memory device 100 can be programmed to enter the memory device 100 into a PAD mode or a PAD test mode. Additionally, or alternatively, mode registers 128 can be programmed to identify or define a specific region of the memory array 150 as a PAD secure region and/or to identify which memory rows of the PAD secure region to disable. The masking circuitry 143 can be enabled (e.g., via one or more signals provided to the row decoder 140 and/or to the masking circuitry 143 by the command decoder 115) responsive to programming of the mode registers 128 or responsive to the memory device 100 entering a PAD mode or a PAD test mode. In some embodiments, mode registers 128 of the memory device 100 can be programmed to enter the memory device 100 into a PAD refresh mode. PAD refresh modes are discussed in greater detail below.

Additionally, or alternatively, the memory device 100 can include a fuse array 114. In some embodiments, the fuse array 114 can be programmed to enable and/or disable a PAD mode or a PAD test mode of the memory device 100. In these and other embodiments, the fuse array 114 can be programmed to identify or define a specific region of the memory array 150 as a PAD secure region. In these and still other embodiments, the fuse array 114 can be programmed to select which memory rows of the PAD secure region to disable. In some embodiments, programming of the fuse array 114 can enable the masking circuitry 143 (e.g., via one or more signals provided to the row decoder 140 and/or to the masking circuitry 143 by the command decoder 115).

As discussed above, the memory device 100 is configured to access (e.g., read, write, erase, etc.) and store data (e.g., determinate or valid data, such as user or system data) to only enabled memory rows of a PAD secure region. Enabled memory rows can be memory rows of a PAD secure region that correspond to memory row addresses that can be decoded by the corresponding row decoder 140. Stated another way, enabled memory rows can be memory rows of a PAD secure region that correspond to memory row addresses that are not disabled or masked. Therefore, disabled memory rows of a PAD secure region are not utilized to store data and cannot be accessed by the memory device 100 or by an external device operably coupled to the memory device 100, at least while decoding of the corresponding memory row addresses is disabled or masked. For example, when the memory device 100 receives a memory address ADDR that corresponds to a memory row that is disabled in a PAD secure region of the memory array 150, the the memory device 100 can ignore the associated command, return an error or null data to the memory controller, or translate the memory address to a memory address corresponding to an enabled memory row of the memory array 150. In some embodiments, a PAD secure region can be restricted such that only the memory device 100 can access memory rows (both enabled and disabled) in the PAD secure region and/or only when the memory device 100 is in a specific mode of operation (e.g., a vendor-specific mode, a test mode, or another mode of operation).

In some embodiments, the memory device 100 can track which regions of the memory array 150 are configured as a PAD secure region and can track which memory rows within each PAD secure region are enabled and/or available to store data. For example, the memory device 100 can track PAD secure regions and enabled memory rows using the fuse array 114, one or more of the registers 128, a dedicated or allocated region of the memory array 150, one or more look-up tables, and/or using other components of the memory device 100. In some embodiments, the memory device 100 can track which regions of the memory array 150 are configured as a PAD secure region and/or which memory rows within the PAD secure region are enabled and/or available to store data, by tracking which regions of the memory array 150 are not configured as a PAD secure region and/or which memory rows within a PAD secure region are disabled and/or are not available to store data. In these and other embodiments, the memory device 100 can be configured to report (e.g., to the memory controller 101 of FIG. 1A) which regions of the memory array 150 are configured as a PAD secure region and/or which memory rows within the PAD secure region are enabled and/or available to store data.

As shown in FIGS. 1B and 2, the command decoder 115 may be configured to output a partial array density signal PAD to the refresh control circuitry 116 and the refresh control circuit 216. The command decoder 115 can activate the partial array density signal PAD when (a) the memory device 100 enters a PAD mode or PAD test mode, and/or (b) when a PAD secure region corresponds to a region of the memory array that corresponds to the refresh control circuitry 116 and/or the refresh control circuit 216. Referring to FIG. 2, for example, the partial array density signal PAD can be input into the RDR state control circuit 282, the refresh address generator circuit 286, and/or one or more other circuits (e.g., the aggressor detector circuit 284) of the refresh control circuit 216.

For the sake of example and clarity, assume that the refresh control circuit 216 of FIG. 2 corresponds to a single memory bank 152 of the memory array 150 of FIG. 1B, that the entirety of the memory bank 152 is configured as a PAD secure region, and that every other memory row in the memory bank 152 is disabled from storing data. In some embodiments, when the partial array density signal PAD is activated, the refresh control circuit 216 can instruct the memory device 100 to refresh enabled memory rows of the memory bank 152 differently from (e.g., according to a different refresh protocol from a refresh protocol used for refreshing) disabled memory rows of the memory bank 152. For example, the refresh control circuit 216 can continue to instruct the memory device 100 to perform auto-refresh operations, targeted refresh operations, and/or panic refresh operations on enabled memory rows of the memory bank 152 consistent with the discussion of the refresh control circuit 216 above. Enabled memory rows of a PAD secure region may be refreshed in accordance with a first refresh schedule that may be the same, similar, or different from (e.g., more relaxed than) refresh schedules of other memory rows of the memory array 150 outside of the PAD secure region. By contrast, the refresh control circuit 216 can instruct the memory device 100 to refresh disabled memory rows of the memory bank 152 in accordance with a second refresh schedule different from (e.g., more relaxed than, modified in comparison to) the first refresh schedule.

For example, in some embodiments, the refresh control circuit 216 can disable RDR service events to disabled memory rows of a PAD secure region. As a specific example, when a match address HitXADD supplied to the refresh address generator circuit 286 from the aggressor detector circuit 284 indicates an aggressor memory row, the refresh address generator circuit 286 can (a) identify a victim memory row based on the match address HitXADD and (b) determine whether the victim memory row corresponds to a disabled memory row within the PAD secure region. When the identified victim memory row corresponds to a disabled memory row in the PAD secure region, the refresh control circuit 216 can prevent the memory device 100 from performing an RDR service event on the disabled memory row (e.g., by ignoring the match address HitXADD, refraining from outputting a refresh address RXADD corresponding to the memory row address of the disabled memory row, and/or outputting a refresh address RXADD corresponding to a memory row address of an enabled memory row in place of the memory row address of the disabled memory row). Additionally, or alternatively, the corresponding row decoder 140 can prevent the memory device 100 from performing an RDR service event on a disabled memory row when the refresh address RXADD corresponds to a memory row address of a disabled memory row in a PAD secure region. In these and other embodiments, depending on the number of disabled memory rows separating enabled memory rows within a given PAD secure region, the refresh control circuit 216 can disable RDR service events to memory rows that are physically adjacent or neighboring an aggressor memory row (e.g., HitXADD+/−1) and/or to memory rows that are positioned other distances from an aggressor memory row (e.g., HitXADD+/−2, +/−3, and/or +/−4). In these and still other embodiments, the refresh control circuit 216 can disable RDR service events to both enabled and disabled memory rows of a PAD secure region when the partial array density signal PAD is activated, or may enable the memory device 100 to perform RDR service events on enabled memory rows of the PAD secure region less frequently when the partial array density signal PAD is activated than when the partial array density signal PAD is not activated. Disabling RDR service events or performing RDR service events less frequently is expected to decrease an amount of power consumed by the memory device 100.

As another example, the refresh control circuit 216 can enable modified RDR service events on one or more disabled memory rows within a PAD secure region. As a specific example, when a match address HitXADD supplied to the refresh address generator circuit 286 indicates an aggressor memory row, the refresh address generator circuit 286 can (a) identify a victim memory row based on the match address HitXADD and (b) determine whether the victim memory row corresponds to a disabled memory row within the PAD secure region. When the identified victim memory row corresponds to a disabled memory row in the PAD secure region that is an immediate physical neighbor of an enabled memory row within the PAD secure region or is within a threshold distance (e.g., three memory rows or less, two memory rows or less) from an enabled memory row within the PAD secure region, the refresh control circuit 216 and/or the row decoder 140 can enable the memory device 100 to perform a modified RDR service event on the disabled memory row. In some embodiments, the modified RDR service event can include firing the corresponding memory row in the memory array 150 without firing the corresponding sense amplifiers SAMP such that memory cells of the corresponding memory row are erased and programmed with a midpoint voltage or indeterminate data (e.g., a bit line precharge voltage $V_{BLP}$). Such modified RDR service events are expected to reduce the amount of power consumed by the memory device 100 in comparison to standard RDR service events. In addition, periodically erasing and programming the memory cells of a disabled memory row is expected to reduce and/or eliminate the risk that voltage $V_{CELL}$ levels stored to the memory cells of the disabled memory row are pumped (e.g., by surrounding aggressor activity, such as from enabled memory rows) to levels that could damage the memory cells. Furthermore, storing a midpoint or half voltage (e.g., the bit line precharge voltage $V_{BLP}$) to memory cells of a disabled memory row is expected to reduce or eliminate stress placed on adjacent memory cells of an enabled memory row in the event of a short between one or more memory cells of the disabled row and one or more memory cells of the enabled memory row, because any midpoint voltage between (a) the half voltage stored in memory cells of the disabled memory row and (b) the high or low state stored to memory cells of the enabled memory row, would likely still be readable by the memory device 100 as the high or low state, respectively. In other words, storing the half voltage to memory cells of disabled memory rows of a PAD secure region is expected to increase data retention and security capabilities of memory cells of enabled memory rows of the PAD secure region.

In these and still other embodiments, the refresh control circuit 216 can enable the memory device 100 to perform modified auto-refresh operations on disabled memory rows of a PAD secure region. As a specific example, when the refresh control circuit 216 outputs a refresh address RXADD for an auto-refresh operation that corresponds to a memory row address of a disabled memory row in a PAD secure region, the memory device 100 can perform a modified auto-refresh operation on the disabled memory row. In some embodiments, the modified auto-refresh operation can include firing the corresponding memory row in the memory array 150 without firing the corresponding sense amplifiers SAMP and/or bit lines such that memory cells of the corresponding memory row are erased and programmed with a midpoint voltage or indeterminate data (e.g., a bit line precharge voltage $V_{BLP}$). These modified auto-refresh operations can be performed on disabled memory rows of a PAD secure region on a same schedule as standard auto-refresh operations are performed on enabled memory rows of the PAD secure region. Alternatively, these modified auto-refresh operations can be performed on a different or a more relaxed schedule (e.g., less often) than the schedule for performing standard auto-refresh operations on enabled memory rows. In some embodiments, a modified auto-refresh operation can include performing a standard auto-refresh operation (e.g., firing the corresponding memory row and the correspond sense amplifiers SAMP and/or bit lines) on disabled memory rows of a PAD secure region, but on a different or a more relaxed schedule (e.g., less often) than the schedule for performing standard auto-refresh operations on enabled memory rows. In other embodiments, auto-refresh operations can be disabled altogether for disabled memory rows of a PAD secure region.

Similar to the modified RDR service events discussed above, performing modified auto-refresh operations on disabled memory rows, refreshing disabled memory rows with auto-refresh operations on a more relaxed schedule, and/or disabling auto-refresh operations altogether for disabled memory rows are each expected to reduce the amount of power consumed by the memory device 100 in comparison to standard auto-refresh operations and/or the standard auto-refresh schedule. In addition, periodically erasing and programming the memory cells of a disabled memory row to a midpoint or half voltage (e.g., the bit line precharge voltage $V_{BLP}$) is expected to reduce and/or eliminate (a) the risk that voltage W ELL levels stored to the memory cells of the disabled memory row are pumped (e.g., by surrounding aggressor activity, such as from enabled memory rows) to levels that could damage the memory cells, and/or (b) stress placed on adjacent memory cells of an enabled memory row in the event of a short between one or more memory cells of the disabled row and one or more memory cells of the enabled memory row.

Figure 3:
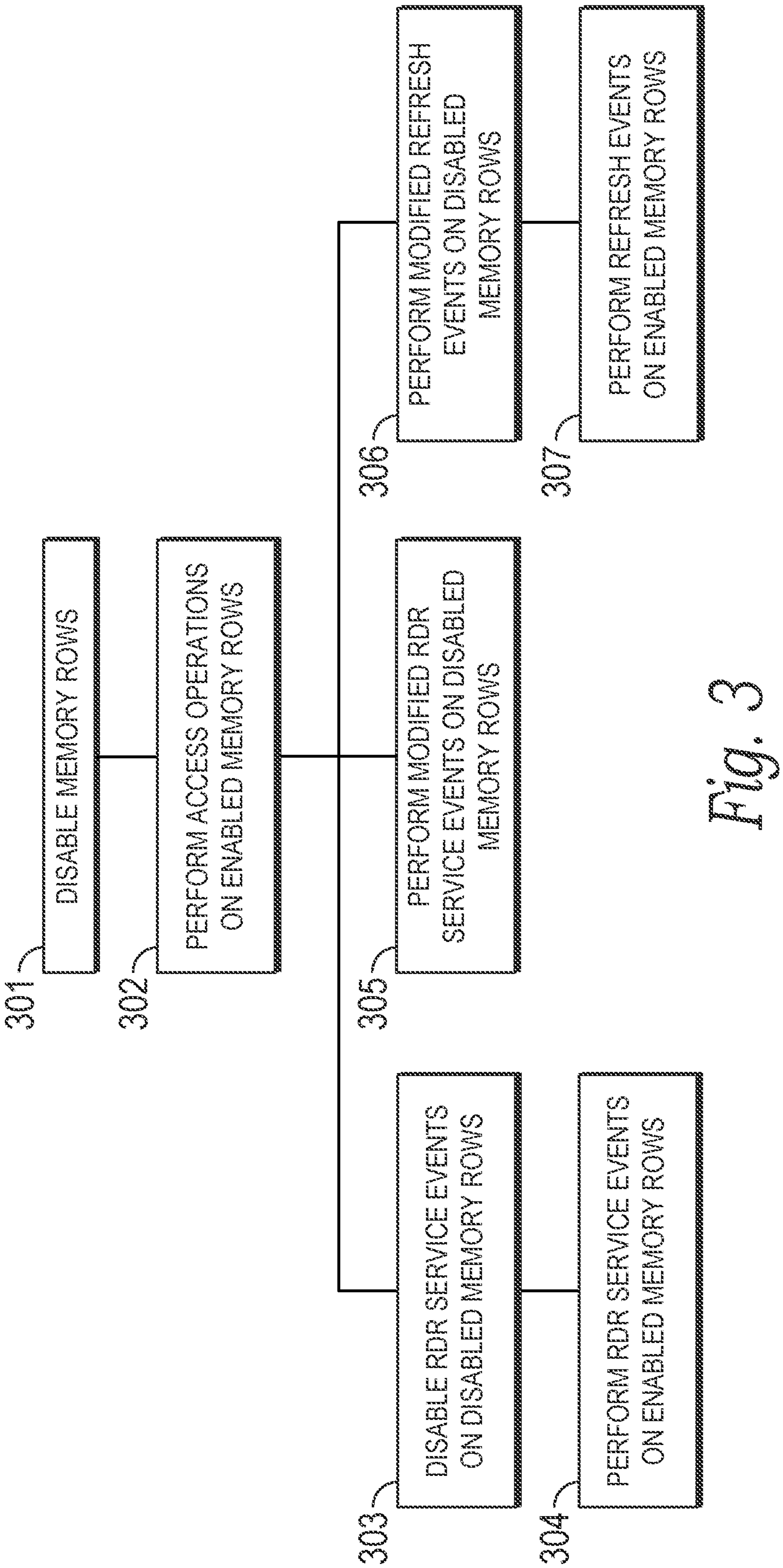
FIG. 3 is a flow diagram illustrating a method of operating a memory device in accordance with various embodiments of the present technology.

FIG. 3 is a flow diagram illustrating a method 300 of operating a memory device and/or a memory system (e.g., a method of operating or managing a PAD secure region) in accordance with various embodiments of the present technology. The method 300 is illustrated as a set of steps or blocks 301-307. All or a subset of one or more of the blocks 301-307 can be executed by components or devices of a memory system, such as the memory system 190 of FIG. 1A. For example, all or a subset of one or more of the blocks 301-307 can be executed by (i) one or more memory devices (e.g., one or more of the memory devices 100 of FIGS. 1A and 1B), (ii) refresh control circuitry (e.g., the refresh control circuitry 116 of FIG. 1B and/or the refresh control circuit 216 of FIG. 2), (iii) row decoders (e.g., the row decoder 140 of FIG. 1B), (iv) command decoders (e.g., the command decoder 115 of FIG. 1B), (v) a memory controller (e.g., the memory controller 101 of FIG. 1A), and/or (vi) a host device (e.g., the host device 108 of FIG. 1A). Furthermore, any one or more of the blocks 301-307 can be executed in accordance with the discussion of FIGS. 1A-2 above.

The method 300 begins at block 301 by disabling memory rows of a PAD secure region. In some embodiments, disabling the memory rows can include identifying the PAD secure region and/or memory rows to be disabled in the PAD secure region. Identifying the PAD secure region and/or the memory rows to be disabled in the PAD secure region can include identifying the PAD secure region and/or the memory rows to be disabled using information programmed to a fuse array, registers (e.g., mode registers), or a region of the memory array of the memory device, or using one or more look-up tables. Identifying the PAD secure region and/or the memory rows to be disabled can include identifying the PAD secure region and/or the memory rows to be disabled using memory row addresses and/or memory bank addresses supplied to address terminals of the memory device (e.g., while the memory device is in a PAD mode or a PAD test mode). For example, memory row address signals can be supplied to address terminals of the memory device (e.g., by a memory controller) when the memory device enters a PAD mode or a PAD test mode, and the address signals can identify a region of a memory array of the memory device to be configured as a PAD secure region and/or memory rows within a PAD secure region to be disabled or left enabled. In some embodiments, disabling the memory rows can include disabling the memory rows while the memory device is in a PAD mode or a PAD test mode. In these and other embodiments, disabling the memory rows can include disabling the memory rows in response to the memory device entering a PAD mode, a PAD test mode, and/or information programmed into the fuse array. Disabling the memory rows can include permanently or temporarily disabling the memory rows. Disabling memory rows can include erasing data stored to the memory rows and/or programming memory cells of the memory rows with midpoint potentials or indeterminate data (e.g., a bit line precharge voltage $V_{BLP}$).

In some embodiments, disabling the memory rows can include disabling or masking row address terms of memory row addresses corresponding to one or more memory rows of the PAD secure region. For example, disabling or masking the row address terms of the memory row addresses can include tying or holding the row address terms to a single state (e.g., a high state or a low state) using bond pins of the memory device. As another example, disabling or masking the row address terms of the memory row addresses can include masking the row address terms (e.g., using masking circuitry or a row decoder of the memory device). Disabling or masking the row address terms of the memory row addresses can include disabling or masking the row address terms such that every other or three out of every four memory rows in the PAD secure region are disabled from being accessed by the memory device, from being accessed by an external device operably coupled to the memory device, and/or from storing data. Disabling or masking the row address terms of the memory row addresses can include disabling or masking the row address terms such that specific memory rows and/or specific ranges of memory rows (e.g., defined in a fuse array, registers, or a region of the memory array of the memory device, and/or defined in addresses received at address terminals of the memory device) are disabled from being accessed by the memory device, from an external device operably coupled to the memory device, and/or from storing data. Disabling the memory rows can include disabling the memory rows such that groups or sets of one or more disabled memory rows are interleaved with groups or sets of one or more enabled memory rows in the PAD secure region. Disabling the memory rows can include disabling the memory rows such that groups or sets of one or more enabled memory rows in the PAD secure region are (e.g., each) separated from one another by at least one disabled memory row in the PAD secure region.

Disabling the memory rows can include tracking the PAD secure region and/or disabled memory rows in the PAD secure region. Tracking the PAD secure region can include storing an identifier of the PAD secure region in the memory device. Storing the identifier can include storing an identifier of memory row addresses corresponding to the PAD secure region. Storing the identifier can include storing the identifier in a refresh control circuit, in a command decoder, in a region of the memory array, in a look-up table, in a row decoder, and/or at other locations within the memory device. Tracking the disabled memory rows can include storing an indication of disabled memory rows in the PAD region and/or an indication of enabled memory rows in the PAD region. Tracking the PAD secure region and/or the disabled memory rows can include outputting an indication of the PAD secure region and/or of the disabled memory rows from the memory device (e.g., to a memory controller or a host device operably coupled to the memory device). Tracking the PAD secure region and/or the disabled memory rows can include storing an indication of the PAD secure region and/or of the disabled memory rows at a location outside of the memory device, such as within a memory controller operably coupled to the memory device.

At block 302, the method 300 continues by performing one or more access operations on one or more enabled memory rows of the PAD secure region. Performing one or more access operations on enabled memory rows of the PAD secure region can include writing data to one or more enabled memory rows of the PAD secure region. In these and other embodiments, performing one or more access operations on enabled memory rows of the PAD secure region can include reading data from one or more enabled memory rows of the PAD secure region. In these and still other embodiments, performing one or more access operations on enabled memory rows of the PAD secure region can include erasing data from one or more enabled memory rows of the PAD secure region. In some embodiments, only the memory device may perform one or more access operations on one or more enabled memory rows of the PAD secure region, and/or only when the memory device is operating in a PAD mode, a PAD test mode, and/or a vendor-specific or other restricted mode of operation. In other embodiments, the memory device, a memory controller operably coupled to the memory device, and/or another host device operably coupled to the memory device may perform one or more access operations on one or more enabled memory rows of the PAD secure region.

Blocks 303-307 of the method 300 relate to performing refresh operations on memory rows of the PAD secure region. The blocks 303-307 are arranged in three separate columns in FIG. 3. In some embodiments, the method 300 can include performing the blocks in a subset (e.g., only one, two of the three) of the columns shown. For example, the method 300 can perform blocks 306 and 307 without performing blocks 303-305. In other embodiments, the method 300 can include performing any combination of the columns shown. For example, the method 300 can include performing all of the blocks 303-307, and/or the method 300 can include performing only blocks 303, 304, 306, and 307. In these still other embodiments, the method 300 can include performing any combination of the blocks shown in a single column. For example, the method 300 can include performing block 303 but not block 304. In these and other embodiments, the method 300 can include performing any combination of the blocks shown from any of the columns. For example, the method 300 can include performing block 304 and block 305 but not blocks 303, 306, and/or 307. For the sake of clarity, the discussion of the method 300 below assumes that each of the blocks 303-307 are performed.

At block 303, the method 300 continues by disabling RDR service events on disabled memory rows of the PAD secure region. In some embodiments, disabling RDR service events for the disabled memory rows of the PAD secure region can include (a) receiving a match address HitXADD indicating a memory row identified as an aggressor memory row, (b) identifying one or more victim memory row addresses based on the match address, (c) determining that at least one victim memory row address of the one or more victim memory row addresses corresponds to at least one disabled memory row of the PAD secure region, and/or (d) refraining from (or preventing the memory device from) performing an RDR service event on the at least one disabled memory row of the PAD secure region. Refraining from (or preventing the memory device from) performing an RDR service event on the at least one disabled memory row of the PAD secure region can include ignoring the match address HitXADD, refraining from (or preventing refresh control circuitry from) outputting at least one refresh address RXADD corresponding to the at least one disabled memory rows, outputting at least one refresh address RXADD corresponding to at least one enabled memory row in lieu of the at least one disabled memory row, and/or ignoring at least one refresh address RXADD received from refresh control circuitry that corresponds to the at least one disabled memory rows of the PAD secure region.

In these and other embodiments, disabling RDR service events for the disabled memory rows of the PAD secure region can include disabling RDR service events for disabled memory rows within a threshold distance from an identified aggressor memory row. For example, because only enabled memory rows of the PAD secure region are accessible and utilized to store data, only enabled memory rows of the PAD secure region may be expected to be identified as aggressor memory rows within the PAD secure region. Thus, disabling RDR service events for disabled memory rows can include (a) performing RDR service events on disabled memory rows physically located immediately adjacent (e.g., HitXADD+/−1) and/or within another threshold distance (e.g., HitXADD+/−2, +/−3, and/or +/−4) from an aggressor memory row, while (b) disabling RDR service events for disabled memory rows physically location outside of the threshold distance.

In these and still other embodiments, disabling RDR service events for the disabled memory rows of the PAD secure region can include performing RDR service events on the disabled memory rows in accordance with a first schedule that instructs the memory device to perform RDR service events on disabled memory rows less frequently than a second schedule that instructs the memory device to perform RDR services events on enabled memory rows. For example, the first schedule can correspond to skipping a specified number (e.g., every third, every other, two out of every three, three out of every four, etc.) RDR service events for a disabled memory row. Thus, disabling RDR service events for the disabled memory rows of the PAD secure region can include skipping the specified number of RDR service events for a disabled memory row before performing an RDR service event on that memory row.

In some embodiments, disabling RDR service events for disabled memory rows of the PAD secure region can include disabling RDR service events for the entire PAD secure region. For example, because only enabled memory rows of the PAD secure region are accessible and utilized to store data, only enabled memory rows of the PAD secure region may be expected to be identified as aggressor memory rows within the PAD secure region. As such, assuming that enabled memory rows of the PAD secure region are separated from one another by enough disabled memory rows that accessing an enabled memory row identified as an aggressor memory row is not expected to significantly affect data stored to memory cells of other enabled memory rows of the PAD secure region, any identified victim memory rows can be expected to be disabled memory rows of the PAD secure region. Therefore, disabling RDR service events for the entire PAD secure region can be expected to disable RDR service events that would otherwise have been performed on only disabled memory rows of the PAD secure region.

At block 304, the method 300 continues by performing RDR service events on enabled memory rows of the PAD secure region. In some embodiments, performing RDR service events on the enabled memory rows can include performing RDR service events on the enabled memory rows in accordance with an RDR service event schedule that is different from an RDR service event schedule of memory rows outside of the PAD secure region. For example, because only enabled memory rows of the PAD secure region are accessible and utilized to store data, only enabled memory rows of the PAD secure region may be expected to be identified as aggressor memory rows within the PAD secure region. In addition, because enabled memory rows within the PAD secure region are separated from one another by at least one disabled memory row, data stored to memory cells of the enabled memory rows is expected to be affected to a lesser degree by aggressor activity on other enabled memory rows within the PAD secure region than data stored to memory cells of an enabled memory row outside of the PAD secure region and surrounded by other enabled memory rows. As such, enabled memory rows within the PAD secure region are not expected to require RDR service events as often as enabled memory rows outside of the PAD secure region. Thus, performing RDR service events on enabled memory rows of the PAD secure region can include performing RDR service events on enabled memory rows of the PAD secure region less frequently than RDR service events are performed on an enabled memory row outside of the PAD secure region. Furthermore, because only enabled memory rows of the PAD secure region are accessible and utilized to store data, performing RDR service events on enabled memory rows of the PAD secure region can include performing RDR service events on enabled memory rows of the PAD secure region more frequently than performing RDR service events on one or more disabled memory rows of the PAD secure region (e.g., to maintain the integrity of data stored to memory cells of enabled memory rows within the PAD secure region).

At block 305, the method 300 continues by performing modified RDR service events on disabled memory rows of the PAD secure region. In some embodiments, performing modified RDR service events on disabled memory rows of the PAD secure region can include (a) receiving a match address HitXADD indicating a memory row identified as an aggressor memory row, (b) identifying one or more victim memory row addresses based on the match address, (c) determining that at least one victim memory row address of the one or more victim memory rows addresses corresponds to at least one disabled memory row of the PAD secure region, (d) performing modified RDR service events on disabled memory rows of the at least one disabled memory row that are within a threshold distance of the match address (e.g., HitXADD+/−1, +/−2, +/−3, and/or +/−4) and/or of an enabled memory row (e.g., enabled memory row address+/−1, +/−2, +/−3, and/or +/−4), and/or (e) refraining from (or preventing the memory device from) performing an RDR service event on disabled memory rows of the at least one disabled memory row that are outside of the threshold distance. As a specific example, performing modified RDR service events on disabled memory rows of the PAD secure region can include performing RDR services events on disabled memory rows of the PAD secure region only when the disabled memory rows are identified as victim memory rows that are physically positioned immediately adjacent a memory row identified as an aggressor memory row (e.g., HitXADD+/−1).

In these and other embodiments, performing modified RDR service events on disabled memory rows of the PAD secure region can include performing RDR service events on memory rows that correspond to memory row addresses that are within a threshold distance from the match address HitXADD (e.g., HitXADD+/−1, +/−2, +/−3, and/or +/−4) without first determining whether such memory row addresses correspond to disabled memory rows within the PAD secure region. For example, because only enabled memory rows of the PAD secure region are accessible and utilized to store data, only enabled memory rows of the PAD secure region may be expected to be identified as aggressor memory rows within the PAD secure region such that any victim memory row addresses that are determined from the match address HitXADD and that are within a threshold distance of the match address can be assumed to correspond to disabled memory rows within the PAD secure region. Therefore, performing modified RDR service events on disabled memory rows of the PAD secure region can include proceeding to perform RDR service events on disabled memory rows of the PAD secure region when an aggressor memory row is identified without first determining whether victim memory row addresses correspond to disabled memory rows.

In some embodiments, performing modified RDR service events on disabled memory rows of the PAD secure region can include firing the disabled memory rows without firing the corresponding sense amplifiers and/or bit lines. Firing the disabled memory rows without firing the corresponding sense amplifiers and/or bit lines can include erasing memory cells of the disabled memory rows and/or programming the memory cells with a midpoint voltage (e.g., a bit line precharge voltage $V_{BLP}$) or indeterminate data. In these and other embodiments, performing modified RDR service events on disabled memory rows of the PAD secure region can include performing the modified RDR services event on the disabled memory rows less frequently than RDR service events are performed on enabled memory rows of the PAD secure region and/or than RDR service events are performed on memory rows outside of the PAD secure region.

At block 306, the method 300 continues by performing modified refresh events on disabled memory rows of the PAD secure region. In some embodiments, performing modified refresh events on disabled memory rows of the PAD secure region can include (a) determining that one or more memory row addresses (e.g., next memory row addresses in a sequence of memory row addresses for auto-refresh operations; memory row addresses received, for example, from a controller and/or associated with a directed refresh management command; etc.) correspond to one or more disabled memory row addresses in the PAD secure region, (b) outputting the one or more memory row addresses as one or more refresh addresses RXADD, (c) receiving the one or more refresh addresses RXADD, (d) determining that at least one memory row address indicated in the one or more refresh addresses RXADD corresponds to at least one disabled memory row of the PAD secure region, and/or (e) performing a modified refresh event on the at least one disabled memory row. In some embodiments, performing the modified refresh event on the at least one disabled memory row can include firing the at least one disabled memory row without firing the corresponding sense amplifiers and/or bit lines. Firing the at least one disabled memory row without firing the corresponding sense amplifiers and/or bit lines can include erasing memory cells of the at least one disabled memory row and/or programming the memory cells with a midpoint voltage (e.g., a bit line precharge voltage $V_{BLP}$) or indeterminate data. In these and other embodiments, performing the modified refresh event on the at least one disabled memory row can include performing the modified refresh event on a same or different (e.g., more relaxed) schedule as standard auto-refresh operations are performed on enabled memory rows of the PAD secure region and/or on memory rows outside of the PAD secure region. In these and still other embodiments, performing modified refresh events on the at least one disabled memory row can include performing a standard auto-refresh event on the at least one disabled memory row, but at a different (e.g., lesser) frequency than the frequency at which standard auto-refresh operations are performed on enabled memory rows of the PAD secure region and/or on memory rows outside of the PAD secure region.

In some embodiments, performing modified refresh events on disabled memory rows of the PAD secure region can include (a) performing modified refresh events on only disabled memory rows that are within a threshold distance of an enabled memory row (e.g., enabled memory row address+/−1, +/−2, +/−3, and/or +/−4), and/or (b) refraining from (or preventing the memory device from) performing a modified refresh event on disabled memory rows that are outside of the threshold distance. As a specific example, performing modified refresh events on disabled memory rows of the PAD secure region can include performing modified refresh events on only disabled memory rows of the PAD secure region that are determined to be physically positioned immediately adjacent an enabled memory row of the PAD secure region (e.g., enabled memory row address+/−1). In these and still other embodiments, performing modified refresh events on disabled memory rows of the PAD secure region can include disabling auto-refresh operations and/or other refresh events for disabled memory rows of the PAD secure region.

At block 307, the method 300 continues by performing refresh events on enabled memory rows of the PAD secure region. In some embodiments, performing refresh events on enabled memory rows of the PAD secure region includes (a) determining that one or more memory row addresses (e.g., next memory row addresses in a sequence of memory row addresses for auto-refresh operations; memory row addresses received, for example, from a controller and/or associated with a directed refresh management command; etc.) correspond to one or more enabled memory row addresses in the PAD secure region, (b) outputting the one or more memory row addresses as one or more refresh addresses RXADD, (c) receiving the one or more refresh addresses RXADD, (d) determining that at least one memory row address indicated in the one or more refresh addresses RXADD correspond to at least one enabled memory row of the PAD secure region, and/or (e) performing a refresh event on the at least one enabled memory row. The refresh event can be a standard auto-refresh event in some embodiments.

In some embodiments, performing refresh events on the enabled memory rows can include performing refresh events on the enabled memory rows in accordance with a refresh event schedule that is different from a refresh event schedule of memory rows outside of the PAD secure region. For example, performing refresh events on enabled memory rows of the PAD secure region can include performing refresh events on enabled memory rows of the PAD secure region less frequently or more frequently than refresh events are performed on memory rows outside of the PAD secure region. In other embodiments, performing refresh events on the enabled memory rows can include performing refresh events on the enabled memory rows in accordance with a refresh event schedule that is the same as a refresh event schedule of memory rows outside of the PAD secure region. In these and other embodiments, performing refresh events on the enabled memory rows can include performing refresh events on the enabled memory rows in accordance with a refresh event schedule that is the same as or is different from a refresh event schedule of disabled memory rows of the PAD secure region. For example, performing refresh events on enabled memory rows of the PAD secure region can include performing refresh events on enabled memory rows of the PAD secure region less frequently or more frequently than refresh events are performed on disabled memory rows of the PAD secure region.

Although the blocks 301-307 of the method 300 are discussed and illustrated in a particular order, the method 300 illustrated in FIG. 3 is not so limited. In other embodiments, the method 300 can be performed in a different order. In these and other embodiments, any of the blocks 301-307 of the method 300 can be performed before, during, and/or after any of the other blocks 301-307 of the method 300. Moreover, a person of ordinary skill in the relevant art will recognize that the illustrated method 300 can be altered and still remain within these and other embodiments of the present technology. For example, one or more blocks 301-307 of the method 300 illustrated in FIG. 3 can be omitted and/or repeated in some embodiments. As a specific example, blocks 303, 304, and/or 305 of the method 300 can be omitted in some embodiments.

Although the present technology is discussed in detail above in the context of disabling memory rows (word lines) in a PAD secure region for the sake of clarity and example, the present technology encompasses disabling one or more memory columns (bit lines) in a PAD secure region in addition to or in lieu of disabling one or more memory rows in the PAD secure region. For example, every other bit line of a PAD secure region can be disabled by disabling or masking column address terms using the column decoder 145 of FIG. 1B and/or corresponding masking circuitry (not shown). Thus, disabled bit lines in a PAD secure region can be used to pad or buffer enabled bit lines in the PAD secure region from one another in some embodiments of the present technology.

Figure 4:
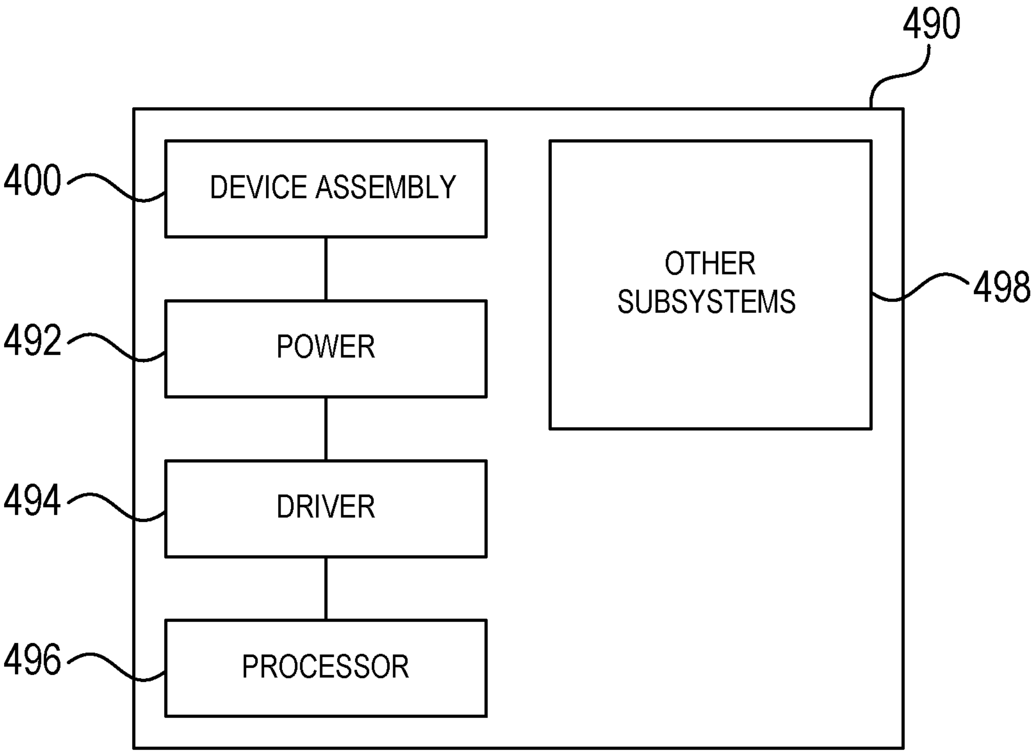
FIG. 4 is a block diagram of a system having a memory device configured in accordance with various embodiments of the present technology.

Any of the foregoing memory systems, devices, and/or methods described above with reference to FIGS. 1A-3 can be incorporated into any of a myriad of larger and/or more complex systems, a representative example of which is system 490 shown schematically in FIG. 4. The system 490 can include a semiconductor device assembly 400, a power source 492, a driver 494, a processor 496, and/or other subsystems and components 498. The semiconductor device assembly 400 can include features generally similar to those of the memory systems, devices, and/or methods described above with reference to FIGS. 1A-3. The resulting system 490 can perform any of a wide variety of functions, such as memory storage, data processing, and/or other suitable functions. Accordingly, representative systems 490 can include, without limitation, hand-held devices (e.g., mobile phones, tablets, digital readers, and digital audio players), computers, vehicles, appliances, and other products. Components of the system 490 may be housed in a single unit or distributed over multiple, interconnected units (e.g., through a communications network). The components of the system 490 can also include remote devices and any of a wide variety of computer readable media.

As used herein, the terms "memory system" and "memory device" refer to systems and devices configured to temporarily and/or permanently store information related to various electronic devices. Accordingly, the term "memory device" can refer to a single memory die and/or to a memory package containing one or more memory dies. Similarly, the term "memory system" can refer to a system including one or more memory dies (e.g., a memory package) and/or to a system (e.g., a dual in-line memory module (DIMM)) including one or more memory packages.

Where the context permits, singular or plural terms can also include the plural or singular term, respectively. In addition, unless the word "or" is expressly limited to mean only a single item exclusive from the other items in reference to a list of two or more items, then the use of "or" in such a list is to be interpreted as including (a) any single item in the list, (b) all of the items in the list, or (c) any combination of the items in the list. Furthermore, as used herein, the phrase "and/or" as in "A and/or B" refers to A alone, B alone, and both A and B. Additionally, the terms "comprising," "including," "having" and "with" are used throughout to mean including at least the recited feature(s) such that any greater number of the same feature and/or additional types of other features are not precluded. Moreover, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; it will be understood by a person of ordinary skill in the art, however, that the signal may represent a bus of signals, where the bus may have a variety of bit widths.

The functions described herein may be implemented in hardware, software executed by a processor, firmware, or any combination thereof. Other examples and implementations are within the scope of the disclosure and appended claims. Features implementing functions may also be physically located at various positions, including being distributed such that portions of functions are implemented at different physical locations.

The above detailed descriptions of embodiments of the technology are not intended to be exhaustive or to limit the technology to the precise form disclosed above. Although specific embodiments of, and examples for, the technology are described above for illustrative purposes, various equivalent modifications are possible within the scope of the technology, as those skilled in the relevant art will recognize. For example, while steps are presented and/or discussed in a given order, alternative embodiments can perform steps in a different order. Furthermore, the various embodiments described herein can also be combined to provide further embodiments.

From the foregoing, it will be appreciated that specific embodiments of the technology have been described herein for purposes of illustration, but well-known structures and functions have not been shown or described in detail to avoid unnecessarily obscuring the description of the embodiments of the technology. From the foregoing, it will also be appreciated that various modifications can be made without deviating from the technology. For example, various components of the technology can be further divided into subcomponents, or that various components and functions of the technology can be combined and/or integrated. Furthermore, although advantages associated with certain embodiments of the technology have been described in the context of those embodiments, other embodiments can also exhibit such advantages, and not all embodiments need necessarily exhibit such advantages to fall within the scope of the technology. Accordingly, the disclosure and associated technology can encompass other embodiments not expressly shown or described herein. To the extent any materials incorporated herein by reference conflict with the present disclosure, the present disclosure controls.

What is claimed is:

1. A method, comprising:

disabling one or more sets of memory rows of a memory region from storing data, wherein— the memory region includes a plurality of memory rows, a plurality of memory columns, and a plurality of memory cells arranged at intersections of the plurality of memory rows and the plurality of memory columns, disabling the one or more sets of memory rows includes disabling or masking decoding of one or more row address terms of memory row addresses corresponding to the memory rows such that the memory rows are not accessible for writing data to or reading data from the memory rows, disabling or masking the decoding of the one or more row address terms includes tying or holding each of the one or more row address terms to a single state, and sets of the one or more sets are interleaved with memory rows within the memory region that are enabled to store data such that each of the memory rows that are enabled to store data includes at least one physically neighboring memory row that is disabled from storing data; and refreshing disabled memory rows of the memory region according to a different refresh protocol from a refresh protocol used for refreshing the enabled memory rows of the memory region, wherein refreshing the disabled memory rows of the memory region according to the different refresh protocol includes performing auto-refresh operations on the disabled memory rows of the memory region, and wherein performing the auto-refresh operations on the disabled memory rows of the memory region includes firing the disabled memory rows without firing corresponding sense amplifiers.

2. The method of claim 1, wherein the memory region includes a first storage capacity corresponding to all memory rows of the memory region enabled to store data, wherein disabling the one or more sets of memory rows of the memory region from storing data includes disabling one or more memory rows from storing data such that the memory region includes a second storage capacity less than the first storage capacity.

3. The method of claim 1, wherein refreshing the disabled memory rows of the memory region according to the different refresh protocol includes disabling row disturb refresh service events to the disabled memory rows.

4. The method of claim 1, wherein refreshing the disabled memory rows of the memory region according to the different refresh protocol includes enabling row disturb refresh service events for only disabled memory rows physically positioned within a threshold distance from a memory row identified as an aggressor memory row in the memory region.

5. The method of claim 4, wherein the threshold distance corresponds to only disabled memory rows physically positioned immediately adjacent the aggressor memory row.

6. The method of claim 4, wherein:

refreshing the disabled memory rows of the memory region according to the different refresh protocol further includes performing the row disturb refresh service events on the disabled memory rows physically positioned within the threshold distance from the aggressor memory row; and performing the row disturb refresh service events includes firing the disabled memory rows physically positioned within the threshold distance from the aggressor memory row without firing corresponding sense amplifiers.

7. The method of claim 1, wherein refreshing the disabled memory rows of the memory region according to the different refresh protocol includes performing row disturb refresh events or auto-refresh operations on the disabled memory rows less frequently than performing row disturb refresh events or auto-refresh operations, respectively, on the enabled memory rows.

8. The method of claim 1, further comprising performing access operations on only the enabled memory rows of the memory region.

9. The method of claim 8, wherein performing the access operations on only the enabled memory rows includes writing data to or reading data from only the enabled memory rows of the memory region.

10. The method of claim 1, further comprising programming mode registers of an apparatus including the memory region such that the apparatus is entered into a mode of operation in which the apparatus is configured to disable the one or more sets of memory rows of the memory region, in which the apparatus is configured to perform access operations on only the enabled memory rows of the memory region, in which the apparatus is configured to refresh the disabled memory rows according to a different refresh protocol from a refresh protocol used for refreshing the enabled memory rows of the memory region, or a combination thereof.

11. The method of claim 1, further comprising:

reading information stored to a fuse array of an apparatus including the memory region; and based at least in part on the information, identifying the memory region; identifying the disabled memory rows in the memory region; entering the apparatus into a mode of operation in which the apparatus is configured to disable the one or more sets of memory rows of the memory region, in which the apparatus is configured to perform access operations on only the enabled memory rows of the memory region, and/or in which the apparatus is configured to refresh the disabled memory rows according to a different refresh protocol from a refresh protocol used for refreshing the enabled memory rows of the memory region; or any combination thereof.

12. The method of claim 1, wherein disabling the one or more sets of memory rows of the memory region from storing data includes disabling the one or more memory rows such that memory row address corresponding to the one or more memory rows cannot be decoded by a row decoder.

13. The method of claim 1, wherein disabling the one or more sets of memory rows of the memory region from storing data includes reversibly disabling or masking decoding of one or more row address terms of memory row addresses corresponding to the memory rows such that the memory rows are temporarily not accessible for writing data to or reading data from the memory rows.

* * * * *